US007227754B2

(12) United States Patent
Griesinger et al.

(10) Patent No.: US 7,227,754 B2
(45) Date of Patent: Jun. 5, 2007

(54) FLUID COOLING FOR IRON CORE AND WINDING PACKS

(75) Inventors: Bernhard Griesinger, Huelben (DE); Ronald Kiebler, Baltmannsweiler (DE)

(73) Assignee: Bosch Rexroth AG, Stuttgart (DE)

( * ) Notice: Subject to any disclaimer, the term of this patent is extended or adjusted under 35 U.S.C. 154(b) by 135 days.

(21) Appl. No.: 11/114,579

(22) Filed: Apr. 26, 2005

(65) Prior Publication Data

US 2005/0243502 A1 Nov. 3, 2005

(30) Foreign Application Priority Data

Apr. 29, 2004 (DE) ...................... 10 2004 021 107

(51) Int. Cl.
*H05K 7/20* (2006.01)

(52) U.S. Cl. ...................... 361/714; 361/699; 361/676; 361/677; 310/64; 336/55; 336/61

(58) Field of Classification Search ................ 361/698, 361/699, 713, 714, 676, 677, 618, 620; 310/11, 310/16, 52–59, 64; 336/57–62, 192, 198, 336/208, 69, 70, 55, 56
See application file for complete search history.

(56) References Cited

U.S. PATENT DOCUMENTS

| | | | | |
|---|---|---|---|---|
| 1,851,184 | A * | 3/1932 | Holmes | 336/61 |
| 6,339,269 | B1 * | 1/2002 | Hsiao | 310/64 |
| 6,563,410 | B1 * | 5/2003 | Marton | 336/55 |

FOREIGN PATENT DOCUMENTS

| | | | |
|---|---|---|---|
| DE | 197 01 269 | A1 | 7/1998 |
| JP | 031240007 | A * | 5/1991 |
| JP | 07297043 | A * | 11/1995 |

* cited by examiner

*Primary Examiner*—Michael Datskovskiy
(74) *Attorney, Agent, or Firm*—Michael J. Striker

(57) ABSTRACT

A power choke or transformer has an iron core, windings, and a cooling apparatus having a heat exchanger with a heat absorber and a cooling fluid duct operationally connected to the heat absorber, wherein the iron core is operationally connected to the heat absorber to remove heat emitted by the iron core.

12 Claims, 2 Drawing Sheets

FLUID COOLING FOR IRON CORE AND WINDING PACKS

BACKGROUND OF THE INVENTION

The invention concerns the cooling of chokes and transformers.

The prior art has disclosed air cooling systems and water cooling systems. But an air cooling system referred to as "improved" takes up a lot of space and also generates an increased amount of noise. Other consequences include a shorter service life due to poor cooling action and a greater environmental impact. Additional effects include increased heating of the immediate vicinity and possibly the switch cabinet. Higher protection classes such as IP 54 can only be achieved with difficulty.

DE 197 01 269 A1 has disclosed a transformer with fluid cooling for the galvanic separation and voltage adaptation of the alternating current and three-phase current systems. The coolant flows through several temperature zones inside the windings and removes the heat via a system of conduits. Designs of this type are costly to manufacture and become unusable in the event of a leak. In addition, this embodiment does not permit existing transformers to be retrofitted since the cooling system is integrated into the design as a structural feature. Modularity is neither provided nor intended.

SUMMARY OF THE INVENTION

Accordingly, it is an object of the present invention to provide an apparatus particularly for cooling winding packs of a power choke or transformer, which avoids the disadvantages of the prior art.

More particularly it is an object of the present invention is to provide an apparatus particularly for cooling winding packs of a power choke or transformer, which should absorb and remove heat from the surface as effectively as possible and at the same time, be simple and inexpensive to manufacture and even permit retrofitting.

The present invention attains this object among other things in that at least one surface of a body, e.g. the iron core of a power choke or transformer, is brought into an operational connection with a heat exchanger. This assures heat removal directly from the surface; the heat is removed by means of the heat exchanger, through which a cooling fluid circulates.

The apparatus is easy and inexpensive to manufacture because the heat exchanger has only one heat absorber and a cooling fluid duct operationally connected to the heat absorber, i.e. the entire apparatus is comprised, more or less, of only two main components. This two-component arrangement can also be attached or retrofitted to the surface of heat-absorbing components. The cooling system can therefore be thought of as a modularly composed system, which is not bound to a particular component and would not absolutely have to be taken into account in the design of a component.

In one useful embodiment, the heat absorber is a deflector plate, preferably a metallic plate, in particular manufactured out of copper. This assures a heat transfer over a large surface, provided that the entire surface is operationally connected to the heat-radiating surface of the component.

It is also advantageous if the cooling fluid duct is preferably embodied as a conduit. The conduit is embodied in the form of a column-shaped hollow body and at least in the region of the operational connection to the absorber, has an angular or rounded cross section. The fluid can also be transported to the heat sources in a targeted manner and independent of the spatial position of the heat exchanger by means of a suitably dimensioned pressure. An angular cross section increases the contact area between the fluid duct and the absorber. A round cross section is less expensive to procure.

If the cooling fluid duct extends in a meandering, spiral, or U-shaped fashion, at least in the region of the operational connection to a heat absorber surface, then this increases the effective thermal transmission with the number of windings since this automatically increases the effective area. It is particularly possible to achieve a stable and positionally independent design if the duct is attached to the absorber surface by means of soldered or welded connections. Naturally it is also possible to produce detachable connections by means of clips or the like. This would considerably reduce the amount of service or maintenance work required in the event of a line rupture.

With an angular or round cross section, soldering or welding paths could be used to increase the contact area between the duct and the absorber. It is also be conceivable for the duct to be partially or completely incorporated into the absorber in order to achieve a further increase in the heat transmission behavior. A filling of possible intermediate spaces between the duct and absorber recesses would compensate for imprecise fits.

If several heat exchangers are connected in series or in parallel in order to cool a number of parts of a component, then a parallel connection yields a virtually larger cross-sectional area of the coolant line and therefore a reduced pressure in the tube system. The series connection, however, would achieve a better utilization of the cooling fluid since it would absorb the heat of several parts.

The present invention is optimally suited for use with at least one iron core and/or one power choke, in particular the power choke of a negative feeding converter (e.g. the converter series SFT from the company Indramat Refu GmbH, with a sinusoidal negative feed). Power chokes must process very powerful currents (approx. 600 Amperes) and have relatively high inductances (approx. 180 μH). Due to the ohmic resistance of the windings, which can be comprised either of individual wires or of copper plates or copper bars, these chokes generate powerful heat losses. If they are not removed, this lost heat can lead to insulation damage and failures and entail consequent follow-up costs.

The apparatus according to present invention, which could optionally be installed during manufacture or added later, depending on the particular instance of use, averts these dangers and avoids unnecessary costs. Naturally, if the same advantages were also applied to transformers or other electrical components, then the same design would be used for cooling purposes.

The novel features which are considered as characteristic for the present invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 1:
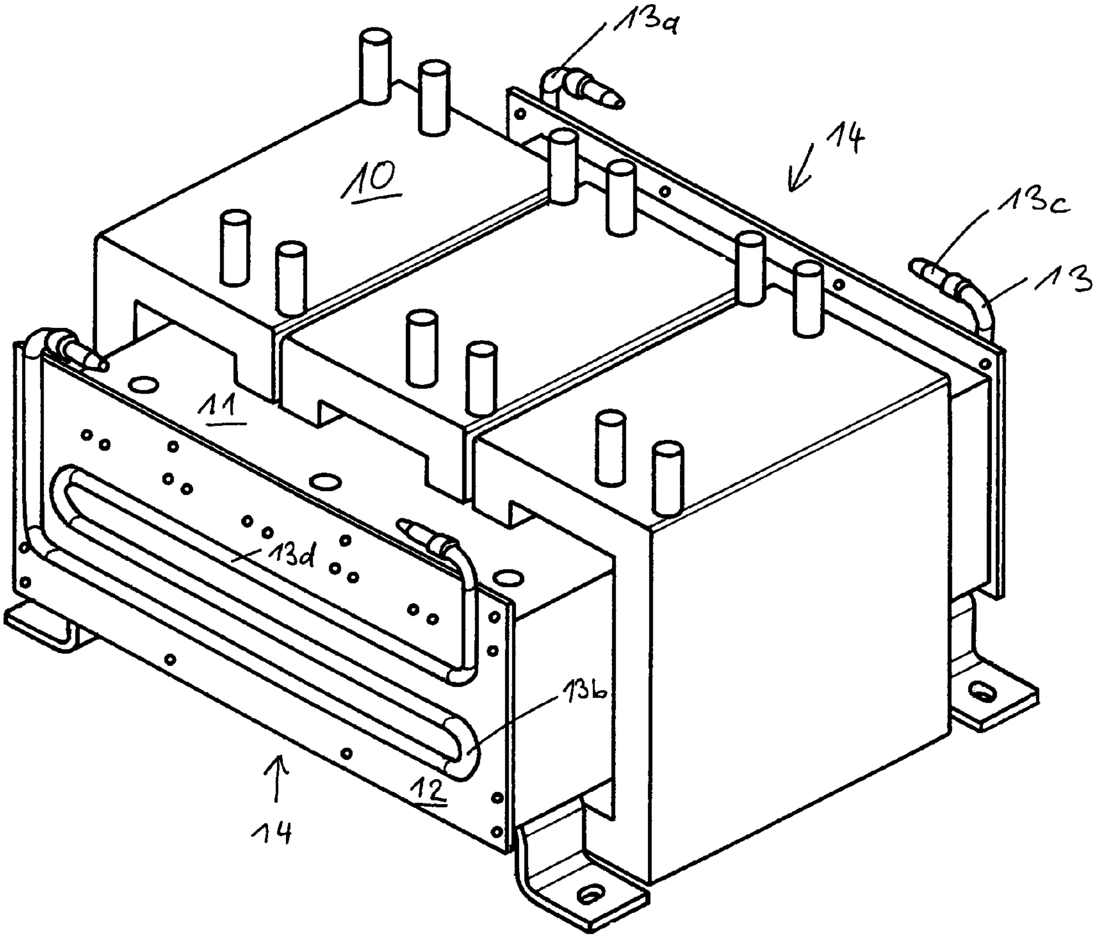
FIG. 1 is a view showing a fluid cooling system in accordance with one embodiment of the present invention.

FIG. 1 shows a first possible embodiment of the present invention, in particular a heat exchanger 14 with a copper plate 12, a meandering cooling tube 13 that has 90° bends 13*a*, 180° bends 13*b*, connecting nipples 13*c*, and straight elements 13*d*, as well as an iron core 11 and winding pack 10.

The components of the converter power choke shown here include three copper windings 10 that have three iron core legs 11 extending through them. The iron core itself serves to channel the magnetic flux generated during operation. A cooling apparatus 14 according to the present invention is attached to each end of the unit. The copper plate 12 is clearly shown, as is the coolant duct 13, which is correspondingly comprised of a large number of individual parts (13*a*, 13*b*, 13*c*, 13*d*). The individual parts can be soldered or welded to one another.

The coolant duct 13 is soldered or attached in some other way to the copper plate in a meandering form and transports the heat emitted by the iron core 11 and absorbed by the heat absorber 12. The two heat exchangers 14 could be connected in parallel or series and supplied with fluid coolant by a pump. The coolant flows through the cooling system with a force that depends on the pressure and cross section and effectively removes the heat absorbed by the absorber and the tube walls 13, 13*a*, 13*b*, and 13*c*. The heat absorber also radiates additional heat to the environment via its surface. An additional cooling effect can be achieved by enlarging this surface, e.g. by means of ribs.

The drawings also show other converter components, which are not relevant to the invention and are thus not described in greater detail, e.g. connecting angles.

Figure 2:
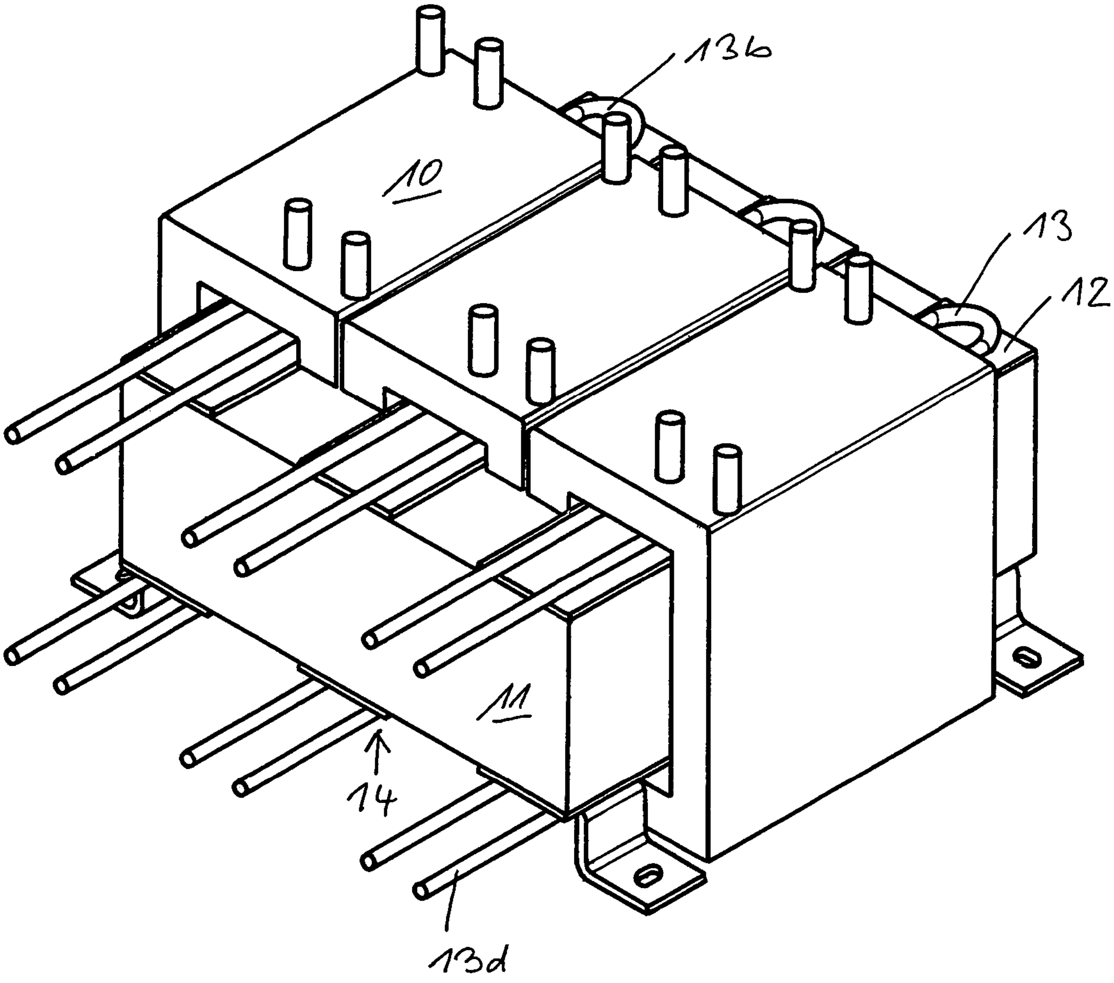
FIG. 2 is a view showing a fluid cooling system in accordance with another embodiment of the present invention.

FIG. 2 shows parts 10, 11, 12, 13, 13*a*, and 13*b* that are largely identical to those in FIG. 1. The difference from FIG. 1 lies in the fact that here, the heat exchangers are attached not to the ends of the iron core 11, but to the top and bottom, and partially inside the iron core encompassed by the copper winding.

The conduit system 13 of the coolant is embodied as U-shaped; connection fittings 13*c* are not shown here.

The lines 13 here are embodied with a round cross section, but this makes the contact surface on the absorber 12 smaller than with a rectangular cross section. For this reason, a rectangular cross section would be preferable; otherwise, the line 13 should be at least partly incorporated into the surface of the absorber.

The heat exchangers, which are labeled as a whole with the reference numeral 6, could then be connected to one another in series or parallel. The applicant prefers the embodiment form shown in FIG. 2. It would naturally also be conceivable and practicable to combine the embodiments in FIG. 1 and FIG. 2 in order to maximize the heat removal.

It is clear from both Figs. that a cooling system according to the present invention could also be installed in existing chokes/transformers. This is true without limitation at least for the design described in FIG. 1. The present invention thus also takes into account the desire to retrofit existing designs. It would be a simple matter to construct a casing around this apparatus, which would respond to the desire for the highest possible protection class and degree of shielding. The invention assures a very high degree of modularity.

It will be understood that each of the elements described above, or two or more together, may also find a useful application in other types of constructions differing from the types described above.

While the invention has been illustrated and described as embodied in fluid cooling for iron core and winding packs, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

The invention claimed is:

1. A power choke or transformer, comprising an iron core; windings; a cooling apparatus, said cooling apparatus having a heat exchanger with a heat absorber and a cooling fluid duct operationally connected to said heat absorber, said iron core being operationally connected to said heat absorber so as to remove heat emitted by said iron core, wherein said cooling fluid duct is configured as a conduit, and wherein said conduit has an angular cross-section at least in a region of an operational connection with said absorber.

2. A power choke as defined in claim 1, wherein said heat absorber is configured as a deflector plate.

3. A power choke as defined in claim 1, wherein said heat absorber is configured as a metallic deflector plate.

4. A power choke as defined in claim 3, wherein said heat absorber is configured as a copper deflector plate.

5. A power choke as defined in claim 1, wherein said cooling fluid duct is configured as the conduit in a form of a column-shaped hollow body.

6. A power choke or transformer, comprising an iron core; windings; a cooling apparatus, said cooling apparatus having a heat exchanger with a heat absorber and a cooling fluid duct operationally connected to said heat absorber, said iron core being operationally connected to said heat absorber so as to remove heat emitted by said iron core, wherein said cooling fluid duct is configured as a conduit, and wherein said conduit has a round cross-section at least in a region of an operational connection with said absorber.

7. A power choke or transformer, comprising an iron core; windings; a cooling apparatus, said cooling apparatus having a heat exchanger with a heat absorber and a cooling fluid duct operationally connected to said heat absorber, said iron core being operationally connected to said heat absorber so as to remove heat emitted by said iron core, wherein said cooling fluid duct extends in a meandering fashion at least in a region of an operational connection with a surface of said heat absorber.

8. A power choke or transformer, comprising an iron core; windings; a cooling apparatus, said cooling apparatus having a heat exchanger with a heat absorber and a cooling fluid duct operationally connected to said heat absorber, said iron core being operationally connected to said heat absorber so as to remove heat emitted by said iron core, wherein said cooling fluid duct extends in a spiral fashion at least in a region of an operational connection with a surface of said heat absorber.

9. A power choke or transformer, comprising an iron core; windings; a cooling apparatus, said cooling apparatus having a heat exchanger with a heat absorber and a cooling fluid duct operationally connected to said heat absorber, said iron core being operationally connected to said heat absorber so as to remove heat emitted by said iron core, wherein said cooling fluid duct extends in a U-shaped fashion at least in a region of an operational connection with a surface of said heat absorber.

10. A power choke or transformer, comprising an iron core; windings; a cooling apparatus, said cooling apparatus having a heat exchanger with a heat absorber and a cooling fluid duct operationally connected to said heat absorber, said iron core being operationally connected to said heat absorber so as to remove heat emitted by said iron core, wherein a number of said heat exchangers are connected in series to cool at least one body.

11. A power choke or transformer, comprising an iron core; windings; a cooling apparatus, said cooling apparatus having a heat exchanger with a heat absorber and a cooling fluid duct operationally connected to said heat absorber, said iron core being operationally connected to said heat absorber so as to remove heat emitted by said iron core, wherein a number of said heat exchangers are connected in parallel to cool at least one body.

12. A power choke or transformer, comprising an iron core; windings; a cooling apparatus, said cooling apparatus having a heat exchanger with a heat absorber and a cooling fluid duct operationally connected to said heat absorber, said iron core being operationally connected to said heat absorber so as to remove heat emitted by said iron core, wherein a number of said heat exchangers are connected in series and in parallel to cool at least one body.

* * * * *